United States Patent
Osanai

(12) 
(10) Patent No.: US 6,465,846 B1
(45) Date of Patent: Oct. 15, 2002

(54) SEMICONDUCTOR INTEGRATED CIRCUIT DEVICE HAVING TRENCH-TYPE PHOTODIODE

(75) Inventor: Jun Osanai, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/532,486

(22) Filed: Mar. 22, 2000

(51) Int. Cl.⁷ .......................................... H01L 31/0392
(52) U.S. Cl. ...................................................... 257/347
(58) Field of Search .................................. 257/347, 348, 257/349, 350, 351, 352, 354; 287/347, 348, 349, 350, 351, 384

(56) References Cited

U.S. PATENT DOCUMENTS 6,180,969 B1 * 2/1990 Yang et al. ................. 257/291
5,399,507 A * 3/1995 Sun ............................. 437/24
6,232,626 B1 * 5/2001 Rhodes ....................... 257/292

* cited by examiner

Primary Examiner—Nathan J. Flynn
Assistant Examiner—Leonardo Andujar
(74) Attorney, Agent, or Firm—Adams & Wilks

(57) ABSTRACT

A semiconductor integrated circuit device has a semiconductor substrate having an SOI region and a bulk region. A buried insulating layer is formed only in the SOI region of the semiconductor substrate. A diode-type photosensor is formed in the bulk region of the semiconductor substrate and is comprised of a trench and a diffusion layer disposed over side surfaces and a lower surface of the trench. A MOS transistor is formed in the SOI region of the semiconductor substrate for processing a signal from the diode-type photosensor.

19 Claims, 2 Drawing Sheets

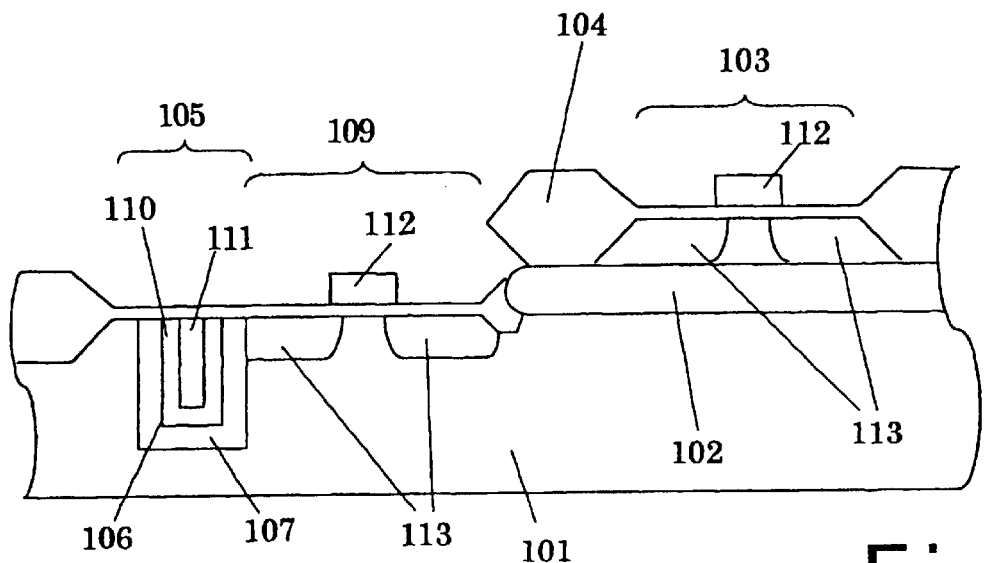
Fig. 3
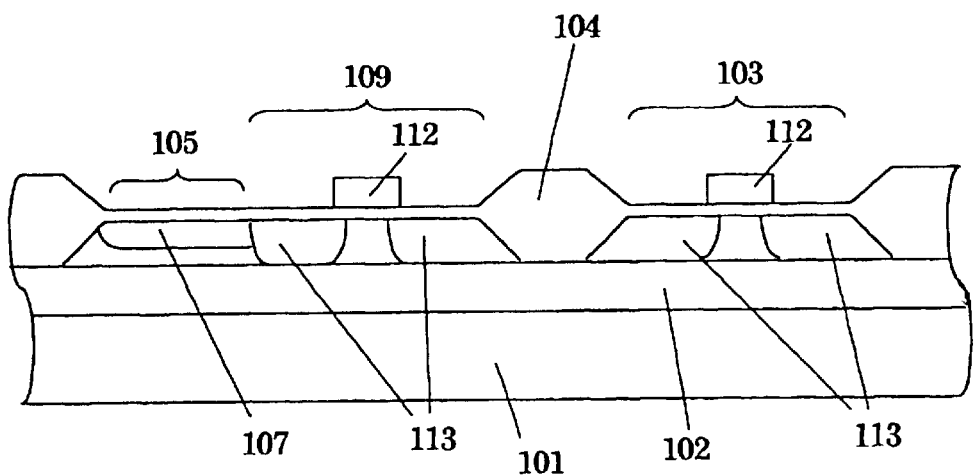
Prior Art        Fig. 4

SEMICONDUCTOR INTEGRATED CIRCUIT DEVICE HAVING TRENCH-TYPE PHOTODIODE

BACKGROUND OF THE INVENTION

1. Field of the Invention

The present invention relates to a method of manufacturing a semiconductor integrated circuit device that uses an SOI (silicon on insulator) type semiconductor substrate, particularly, to an effective technique with which a diode type photosensor and its signal processing circuit are mounted on one chip.

2. Description of the Related Art

A conventional semiconductor integrated circuit device using an SOI substrate is shown in section in FIG. 4. In the conventional device, a diode 105 type photosensor is of so-called "planar type," and the diode 105 type photosensor and its signal processing circuit are formed in a surface semiconductor that is insulated and isolated by a semiconductor substrate 101 and a buried insulating film 102. The signal processing circuit is formed on the SOI substrate to obtain low voltage operation, low power consumption and higher operation speed, and to avoid influence of the noise.

In recent years, higher resolution has been required for line type image sensor ICs and area image sensor ICs equipped with a diode type photosensor, which in turn demands downsizing of the cell of the diode type photosensor. However, reduction of the size of the cell while keeping the S/N ratio of the photosensor at or above a given value has been difficult to attain because the noise level is not decreased in proportion to the cell size, though the absolute value of a signal per unit cell becomes small as a result of the reduction of the cell size.

SUMMARY OF THE INVENTION

The foregoing and other objects of the present invention are carried out by a semiconductor integrated circuit device comprising a semiconductor substrate having an SOI region and a bulk region, a buried insulating layer formed only in the SOI region of the semiconductor substrate, a diode-type photosensor formed in the bulk region of the semiconductor substrate and comprised of a trench and a diffusion layer disposed over side surfaces and a lower surface of the trench, and a MOS transistor formed in the SOI region of the semiconductor substrate for processing a signal from the diode-type photosensor.

In another embodiment, the diode-type photosensor further comprises an insulating film disposed in the trench. In yet another embodiment, the diode-type photosensor further comprises an insulating film disposed in the trench and a polycrystalline silicon film disposed on the insulating film for receiving an electric potential.

BRIEF DESCRIPTION OF THE DRAWINGS

In the accompanying drawings:

FIG. 3 is a sectional view schematically showing still another embodiment of a semiconductor integrated circuit device according to the present invention; and FIG. 4 is a sectional view schematically showing an example of a conventional semiconductor integrated circuit device.

DETAILED DESCRIPTION OF THE PREFERRED EMBODIMENTS

Embodiments of the present invention will now be described.

Figure 1:
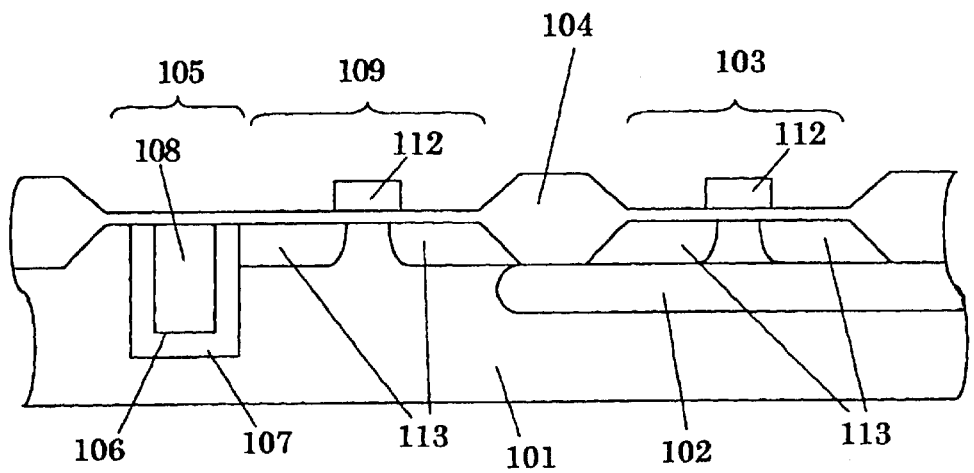
FIG. 1 is a sectional view schematically showing an embodiment of a semiconductor integrated circuit device according to the present invention.

FIG. 1 is a sectional view schematically showing an embodiment of a semiconductor integrated circuit device according to the present invention. oxygen ions are selectively implanted in a semiconductor substrate 101 that is P type single crystal silicon using, for example, the SIMOX (separation by implanted oxygen) method to partially form a buried insulating film 102. The partially formed buried insulating film 102 defines a region insulated from the semiconductor substrate 101 (hereinafter referred to as SOI region). This naturally means that a region that is off the selective formation of the buried insulating film is a region where the single crystal silicon substrate 101 is untouched (hereinafter referred to as bulk region). In other words, a semiconductor region in the semiconductor substrate 101 is placed above the buried insulating film 102 that is selectively formed.

In the SOI region, a first MOS transistor 103 constituting a signal processing circuit is formed and a field oxide film 104 the bottom of which reaches the buried insulating film 102 is formed in the flat periphery of the first MOS transistor 103. The SOI region is thus completely insulated from its surroundings. Formed in the bulk region, on the other hand, is a photodiode 105 comprising: a groove-like trench 106; an N type diffusion layer 107 formed on the side walls and the bottom of the trench 106; and an insulating film 108 filling the inside of the trench 106. In the bulk region, a second MOS transistor 109 for transferring a signal obtained by the photodiode 105 is further formed.

The first and the second MOS transistors 103, 109 have gate electrodes 112 and diffusion regions 113 that serve as source/drain regions.

The width of the trench 106 constituting the photodiode ranges from 0.3 μm to 3.0 μm, and the depth thereof is about 1 μm to 10 μm, though depending on the wavelength of subject light. In FIG. 1, smallness of the flat surfaces is supplemented by a large effective region in the diffusion layer which can collect carriers generated through absorbing light, making it possible to form a compact cell without reducing the S/N ratio. This structure is effective particularly to the longwave side.

Figure 2:
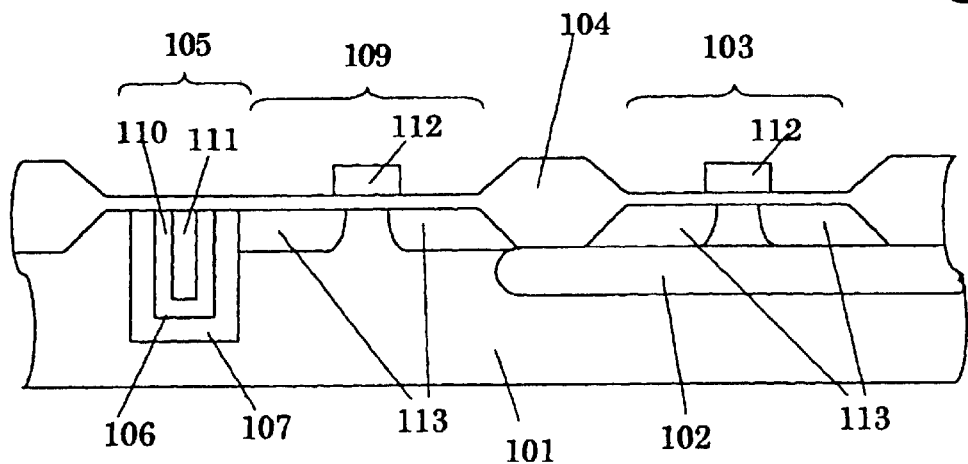
FIG. 2 is a sectional view schematically showing another embodiment of a semiconductor integrated circuit device according to the present invention.

FIG. 2 is a sectional view schematically showing another embodiment of a semiconductor integrated circuit device according to the present invention. The first MOS transistor 103 for signal processing in the SOI region is the same as in the embodiment illustrated in FIG. 1. However, it is the structure in the trench 10 of the photodiode 105 that is different. An N type diffusion layer 107 is formed on the inner walls of the trench 106. On the surface of the layer, an insulating film 110 is formed and polycrystalline silicon 111 is formed on the surface of the insulating film 110. In this structure, the polycrystalline silicon 110 is given an electric potential.

Though not shown, an electric potential is generated by electrically bringing the polycrystalline silicon 111 into contact with a metal wiring through a contact hole. The main source region for noise signals detected by the photodiode 105 is interface levels spotted throughout the interface between the surface of the semiconductor substrate 101 and the insulating film. According to the structure of this embodiment, the interface levels are substantially reduced by giving the polycrystalline silicon 111 an electric potential with which the interface levels are closed up with holes. The noise level is thus drastically reduced.

FIG. 3 is a sectional view schematically showing still another embodiment of a semiconductor integrated circuit device according to the present invention. FIGS. 1 and 2 show embodiments in which the SOI region is selectively formed in the semiconductor substrate. On the other hand, in the embodiment illustrated in FIG. 3, the entire region of the semiconductor substrate is once formed into the SOI region, and then the semiconductor substrate is exposed by selectively removing the surface semiconductor layer and the insulating film using photolithography and dry etching to form the photodiode 105 in the exposed area. The effect obtained is the same as those of the embodiments shown in FIGS. 1 and 2.

As described above, the structure of the present invention realizes a photodiode high in S/N ratio and compact in size, providing a line or area type image sensor integrated circuit device with a high resolution.

What is claimed is:

1. A semiconductor integrated circuit device comprising:
   a semiconductor substrate having an SOI region and a bulk region;
   a buried insulating layer formed only in the SOI region of the semiconductor substrate;
   a diode-type photosensor formed in the bulk region of the semiconductor substrate and comprised of a trench and a diffusion layer disposed over side surfaces and a lower surface of the trench; and
   a MOS transistor formed in the SOI region of the semiconductor substrate for processing a signal from the diode-type photosensor.

2. A semiconductor integrated circuit device as claimed in claim 1; wherein the diode-type photosensor further comprises an insulating film disposed in the trench.

3. A semiconductor integrated circuit device as claimed in claim 1; wherein the diode-type photosensor further comprises an insulating film disposed in the trench and a polycrystalline silicon film disposed on the insulating film for receiving an electric potential.

4. A semiconductor integrated circuit device according to claim 1; further comprising a MOS transistor formed in the bulk region of the semiconductor substrate.

5. A semiconductor integrated circuit device according to claim 1; wherein the trench has a width in the range of 0.3 $\mu$m to 3.0 $\mu$m.

6. A semiconductor integrated circuit device according to claim 5; wherein the trench is disposed at a depth of 1 $\mu$m to 10 $\mu$m from a surface of the semiconductor substrate.

7. A semiconductor integrated circuit device according to claim 1; wherein the trench is disposed at a depth of 1 $\mu$m to 10 $\mu$m from a surface of the semiconductor substrate.

8. A semiconductor integrated circuit device according to claim 1; wherein the semiconductor integrated circuit device comprises an image sensor.

9. A semiconductor integrated circuit device comprising: a semiconductor substrate; a buried insulating film formed in the semiconductor substrate; a photosensor comprised of a groove-like trench formed in a region of the semiconductor substrate in which the buried insulating film is not formed; and a MOS transistor formed over the insulating film for processing a signal from the photosensor.

10. A semiconductor integrated circuit device according to claim 9; wherein the buried insulating film forms an SOI region of the semiconductor substrate.

11. A semiconductor integrated circuit device according to claim 9; wherein the photosensor comprises a photodiode.

12. A semiconductor integrated circuit device according to claim 9; further comprising a MOS transistor disposed in the region of the semiconductor substrate in which the buried insulating film is not formed.

13. A semiconductor integrated circuit device according to claim 9; wherein the trench has a pair of side surfaces and a lower surface; and wherein the photosensor further comprises a diffusion layer surrounding side and lower surfaces of the trench.

14. A semiconductor integrated circuit device according to claim 13; wherein the photosensor further comprises an insulating film disposed in the trench.

15. A semiconductor integrated circuit device according to claim 14; wherein the photosensor further comprises a polycrystalline silicon film formed on the insulating film disposed in the trench.

16. A semiconductor integrated circuit device according to claim 9; wherein the trench has a width in the range of 0.3 $\mu$m to 3.0 $\mu$m.

17. A semiconductor integrated circuit device according to claim 16; wherein the trench is disposed at a depth of 1 $\mu$m to 10 $\mu$m from a surface of the semiconductor substrate.

18. A semiconductor integrated circuit device comprising: a semiconductor substrate; a buried insulating film formed in a surface of the semiconductor substrate to define an SOI region of the semiconductor substrate; a photodiode formed in a region of the semiconductor substrate other than the SOI region, the photodiode comprising a trench formed in the surface of the semiconductor substrate and having side surfaces and a lower surface, a diffusion layer surrounding the side and lower surfaces of the trench, and an insulating film disposed in the trench; a first MOS transistor formed in the SOI region of the semiconductor substrate; and a second MOS transistor formed in the region of the semiconductor substrate other than the SOI region.

19. A semiconductor integrated circuit device according to claim 18; wherein the photosensor further comprises a polycrystalline silicon film formed on the insulating film disposed in the trench.

* * * * *